(12) United States Patent
Kuster

(10) Patent No.: US 8,274,796 B2
(45) Date of Patent: Sep. 25, 2012

(54) MOBILE DATA STORAGE DEVICE WITH ENHANCED CAPACITY

(76) Inventor: Martin Kuster, Walchwil (CH)

( * ) Notice: Subject to any disclaimer, the term of this patent is extended or adjusted under 35 U.S.C. 154(b) by 285 days.

(21) Appl. No.: 12/554,334

(22) Filed: Sep. 4, 2009

(65) Prior Publication Data

US 2010/0202106 A1    Aug. 12, 2010

(51) Int. Cl.
*H05K 7/02* (2006.01)
(52) U.S. Cl. .................... 361/752; 361/737; 439/131
(58) Field of Classification Search .............. 361/737, 361/752; 439/131; 257/679; 235/492
See application file for complete search history.

(56) References Cited

U.S. PATENT DOCUMENTS

| | | | | |
|---|---|---|---|---|
| 7,249,978 B1 * | 7/2007 | Ni | ............................ | 439/660 |
| 7,347,736 B2 * | 3/2008 | Ni | ............................ | 439/660 |
| 7,359,208 B2 * | 4/2008 | Ni | ............................ | 361/752 |
| 7,466,556 B2 * | 12/2008 | Hiew et al. | ............. | 361/737 |
| 2007/0076382 A1 * | 4/2007 | Ni | ............................ | 361/752 |
| 2008/0276099 A1 * | 11/2008 | Nguyen et al. | ........ | 713/186 |
| 2010/0075517 A1 * | 3/2010 | Ni et al. | ................. | 439/131 |

* cited by examiner

*Primary Examiner* — Dameon Levi
(74) *Attorney, Agent, or Firm* — Kilpatrick Townsend & Stockton LLP

(57) ABSTRACT

The invention relates to a mobile data storage device (1) with high storage density, comprising a flat support layer (3) with a first (10) and second (5) flat side, a communication connection (2) with a contact section (9) and at least one semiconductor storage device (4), which is designed as a non-volatile read-write memory. The support layer (3) is arranged with a section of the first flat side (10) on a mounting surface (11) of the contact section (9) and the mounting surface (11) is offset relative to the middle plane (22) of the communication connection (2) in a direction perpendicular to the middle plane (22). Furthermore, the invention relates to a pocket-size tool or tool card with a data storage device.

22 Claims, 4 Drawing Sheets

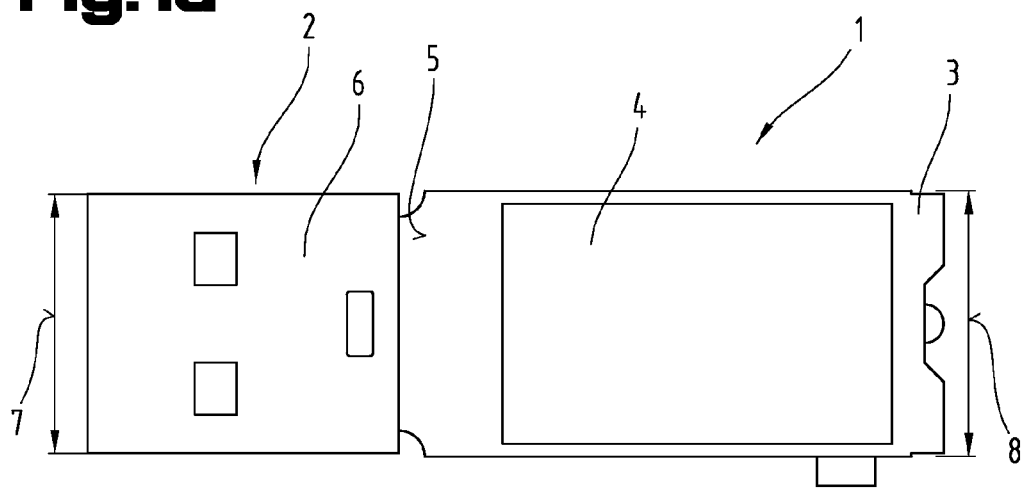
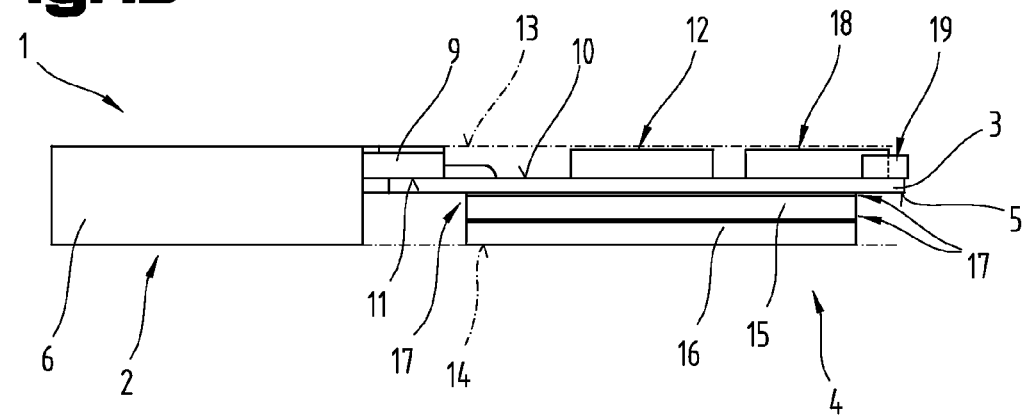
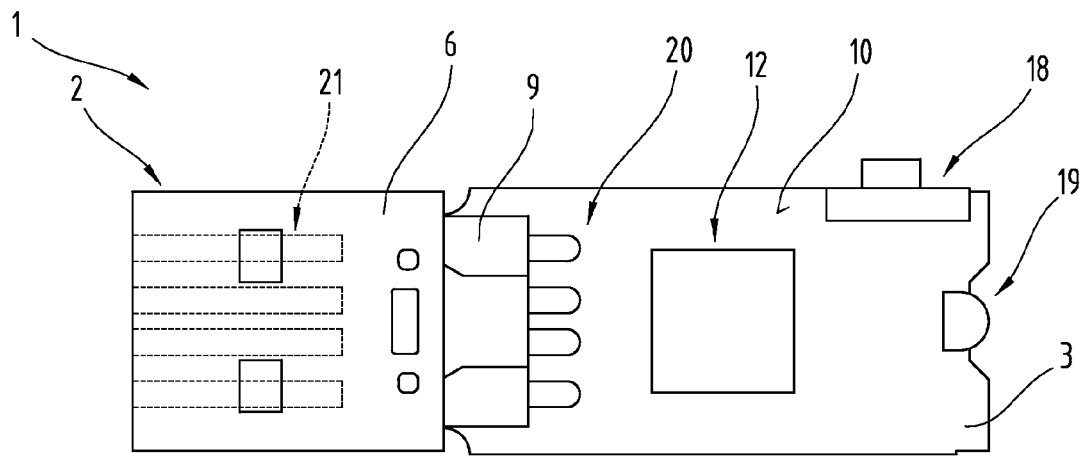

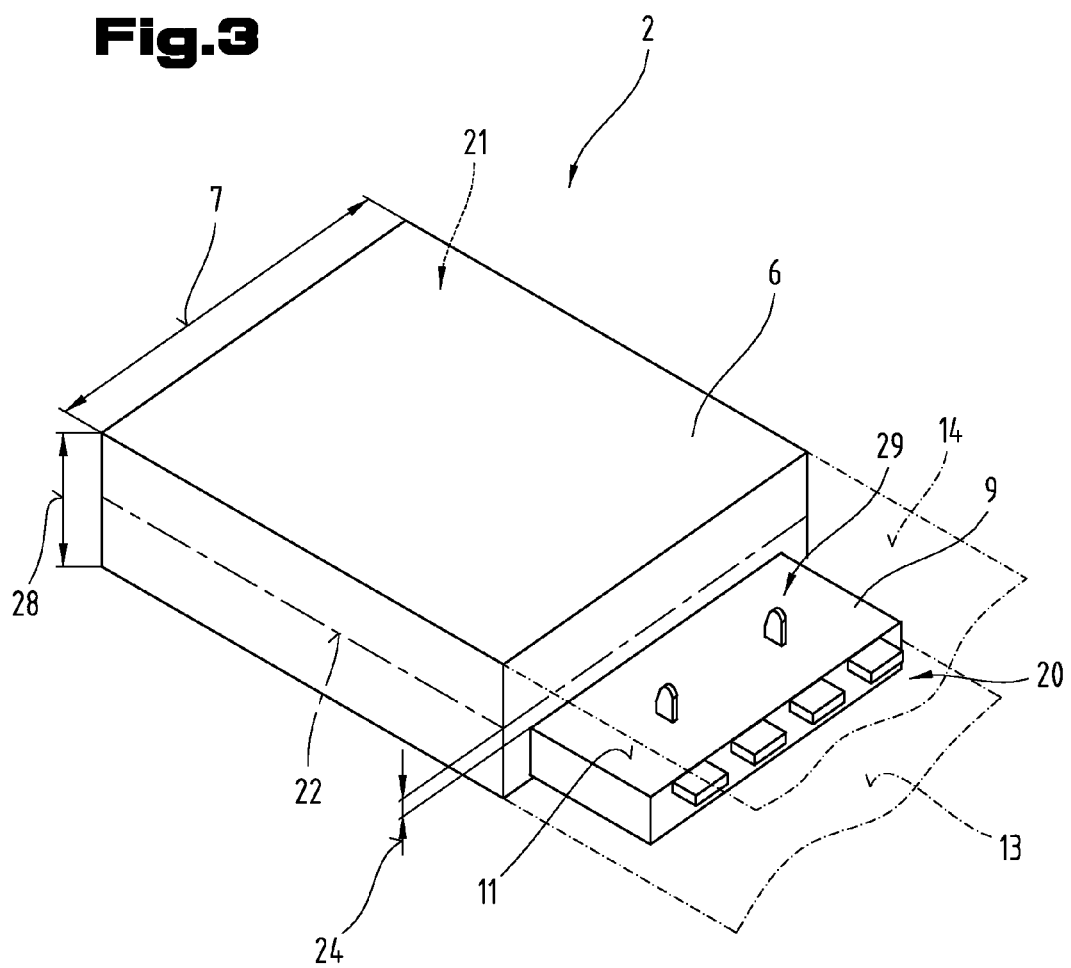

MOBILE DATA STORAGE DEVICE WITH ENHANCED CAPACITY

The invention relates to a mobile data storage device comprising a flat support layer with a first and second flat side, a communication connection with a contact section and at least one semiconductor storage device.

In most cases mobile data storage devices need to have a very compact structure, so as to be able to concentrate the largest possible data storage volume into the smallest possible space. Furthermore, to enable universal use and ensure replaceability the mobile data storage device is mostly designed with a communication connection, which is widespread in the field of data processing devices and enables a simple communication-technological connection of the mobile data storage device with a data processing device. Owing to the required compact dimensions of the connectors communication connections are mostly used with a serial data transfer protocol, whereby to adjust the communication protocol with regard to data and signal-technical parameters generally an additional control device is required. Owing to the geometric dimensions of the storage modules and in particular the dimensions of the control device as well as the signal-technical adjustment devices, it is known to arrange the storage module and control device and signal adjustment devices on both sides of a support layer, in order to achieve a structure that is as compact as possible. The available free space between the flat sides of the support layer and the boundary surfaces, determined freely by the dimensions of the connector, is determined by means of the arrangement of the support layer to achieve an electrical connection with the contacts of the connector. In particular, in known devices a flat side of the support layer is arranged substantially at the level of the middle plane of the connector. Owing to the unavoidable thickness of the support layer with respect to the imaginary boundary planes an asymmetrical space is provided, which is a disadvantage for achieving high storage density, as owing to the limited space available the arrangement of several storage modules is not possible without affecting the imaginary boundary planes with this arrangement.

The objective of the invention is to form a compact mobile data storage device, which always has a higher storage density per unit of volume compared to known devices. Furthermore, the objective of the invention is to design the mobile data storage device such that a protected arrangement is possible in a device in daily use.

The objective of the invention is achieved in that the mounting surface of the contact section is offset relative to the middle plane of the communication connection in a direction perpendicular to the middle plane. By means of this design the particular advantage is that the space ratios between the flat sides of the support layer and the imaginary boundary planes improve advantageously in that essentially the space ratios are evened out. In this way in an advantageous manner it is achieved that the distance between the second flat side and the second boundary plane is increased significantly, without reducing in this way the distance between the first flat side and the first boundary plane for the arrangement of components. In known arrangements the space ratios were mostly divided very unevenly, so that available space could not be used optimally for the arrangement of storage modules.

In an advantageous manner the mounting surface is arranged offset towards the first boundary plane, whereby the middle plane of the support layer is located at a much smaller distance from the middle plane of the communication connection, than was the case in known arrangements. By means of the displacement of the mounting surface according to the claims in an advantageous manner the space distribution is improved, without impairing the mechanical stability or support properties of the contact section.

According to one development the communication connection is formed by a couplable connector. One requirement of mobile data storage devices is for example that the latter can be connected rapidly and easily with a data processing device. Owing the preferred compact design of the mobile data storage device particular demands are made of the communication connection, as the latter on the one hand has to ensure the power supply and communication connection of the mobile data storage device and the communication connection also has to ensure mechanical securing of the mobile data storage device to the data processing device. In the field of data processing devices a plurality of communication connections are known, which meet both the requirements of power supply and data transfer and also the mechanical holding requirements but still have a compact design. Non-locking examples of such communication connections are D-sub and PS/2 connectors. A person skilled in the art would know a plurality of other connectors which meet the necessary requirements.

A particularly advantageous development is obtained if the connector is designed as a USB-connector. Particularly preferable, is a type A design according to DIN IEC 61076-3-107, and also connectors of type B according to DIN IEC 61076-3-108 are possible. The particular advantage of this embodiment is that the connectors are designed to be protected against polarity reversal and protected against inversion and also there is a defined ensured contacting of the power supply terminals prior to the contacting of the data terminals. A further advantage is that the USB-connectors are designed to be very robust, which ensures a long period of use and furthermore due to the low number of contacts very high contact safety is provided. A further crucial advantage is that USB-connectors are very widespread in the field of data processing devices. Furthermore, USB supports a so-called hot-plug functionality, the mobile data storage device according to the invention can thus largely be connected without any precautions to a data processing device or separated from the latter.

The communication connection is designed on the one hand in accordance with the standards and thus has the corresponding dimensions and contacts to connect the mobile data storage device to a data processing device. On the other hand, the communication connection, in particular the contact section is designed such that the contact surfaces of the contact section are connected so as to conduct electricity with corresponding contact surfaces on the first flat side of the support layer. The arrangement of the contact surfaces on the contact section can be adjusted in a particularly advantageous manner directly to the requirements of the components on the first or second flat side of the support layer. By means of said contact surfaces the contacts of the communication connection are connected to the components on the first or second flat side of the support layer so as to conduct electricity.

It is also a particular advantage if the contact section comprises means for mechanically fixing the support layer, as in this way the mechanical securing of the support layer and thus the transfer of any forces does not need to be performed solely by the hearing surface. Owing to the compact dimensions the hearing surface is mostly designed to be very small, which generally restricts the transmitted holding forces determined by the arrangement of the support layer on the mounting surface. The design according to the invention ensures that the weight of the support layer and the components arranged thereon and any forces are transferred to the contact section and thus to the communication connection, without loading the contact surface excessively.

For the electrical and data-technical contacting of the semiconductor-storage device as well as further components it is an advantage if the support layer is formed by a circuit board, as the latter can have both a mechanical support function as well as an electrical connecting function, in particular if the latter is designed for example as a multi-layer circuit board. Detailed designs of circuit boards, in particular multi-layer circuit boards are known to a person skilled in the art and thus are not explained in more detail here.

According to a particularly advantageous development the thickness of the support layer is less than 1 mm. A thin support layer according to the invention makes it possible together with the arrangement according to the invention, to reduce the offset between the middle plane of the support layer and the middle plane of the communication connection or connector significantly and thus create more available space between the first and second flat side and the first and second boundary plane.

In a particularly advantageous development the middle plane of the support layer is arranged offset by a distance from the middle plane of the communication connection to the first boundary plane. By means of this design, which is characterised by a corresponding thickness of the support layer and a corresponding offset of the mounting face, a balanced amount of space is provided between the first and second flat side and the first and second boundary plane. In particular, in this way the space between the support layer and the second boundary plane is significantly increased.

Owing to the requirement for compactness the communication connection is mostly formed by a serial communication connection, whereby also the transferred data are designed with respect to their electrical level to be particularly operationally reliable. To control the communication, i.e. execute the communication protocol and in particular control the access to the semiconductor-storage device according to one development, a communication and access control is arranged on the first flat side of the support layer. Even highly integrated electronic components for adjusting the signal with respect to its electrical signal level have a significant overall height. The arrangement on the first flat side due to the arrangement according to the invention compared to known arrangements has the advantage that despite the reduction of the available space between the first flat side and the first boundary plane there is still sufficient space available to accommodate the larger volume electronic components on the first flat side, without affecting the imaginary first boundary plane.

According to one development the semiconductor storage device is formed by a first semiconductor-storage module, which is arranged on the second flat side of the support layer. Owing to the arrangement according to the invention between the second flat side and the second boundary plane compared to known arrangements there is much more available space, whereby also semiconductor-storage modules can be arranged which have a greater storage density and thus mostly need a greater volume.

A particularly advantageous development is obtained if the semiconductor storage device comprises a second semiconductor-storage module, which is arranged above the first semiconductor storage module. This design makes it possible when using standard components to continually double the storage capacity of the mobile data storage device according to the invention compared to known arrangements. By using standard components also no additional effort is required for supplying the storage modules with power or data, the existing connecting lines can be used many times. Owing to further technical development the storage density per semiconductor storage module will increase continually, whereby due to the development according to the claims of the mobile data storage device according to the invention the latter provides a much higher storage capacity per volume unit than is possible with known arrangements. This development has the advantage from a manufacturing point of view that the second semiconductor storage module can be arranged by standardised automatic manufacturing devices, which also represents a considerable cost saving.

To achieve increased operational safety an embodiment is advantageous in which the first and second semiconductor storage module are arranged spaced apart from one another. Between the modules for example an air gap, a heat-conducting cooling surface or a heat-conducting gel can be arranged, which removes the lost heat of the storage modules from the intermediate chamber and thus in an advantageous manner ensures the maintenance of thermal operating parameters of the semiconductor storage modules. During access to the storage modules, in particular high speed access, owing to the unavoidable loss of heat from the modules there may be a dangerous rise in temperature. By means of the design according to the invention a at least a portion of said lost heat is removed form the modules and if necessary removed to a surrounding module or into the surrounding air, and thus operational safety is ensured.

According to advantageous developments the distance between the first and second boundary plane and the first or second flat side of the support layer is determined. As the distance between the first boundary plane and the flat side of the support layer is in the region of 1.40 mm to 1.60 mm it is ensured that electronic components with a greater overall height, such as for example components for adjusting the electrical level and mechanical switching elements can be arranged on the first flat side, without affecting the first boundary plane. Furthermore, a distance between the second boundary plane and the second flat side of the support layer of in the region of 2.65 mm to 2.90 mm ensures that larger volume semiconductor storage devices as well as at least two storage modules can be arranged above one another, without affecting the second boundary plane.

For the design of a mobile data storage device that is as compact as possible a development is advantageous in which the width of the support layer is smaller than or equal to the width of the communication connection. As in the region of the communication partners of data processing devices only a small amount of space is available, the design according to the invention has the advantage that the mobile data storage device in cross section corresponds substantially to that of the communication connection, thereby providing particularly good handling of the data processing device.

Similarly with respect to a design of the mobile data storage device according to the invention that is as compact as possible a development is advantageous in which the height of the support layer including the components arranged on the first and second flat side is lower or equal to the height of the communication connection. As already described above, according to the claims a mobile data storage device can be designed with dimensions that correspond in cross section substantially to those of the communication connection.

According to an advantageous development the communication and access control comprises a switch for selecting the operating mode and/or a display for showing the operating mode. The switch for selecting the operating mode is designed for example as a mechanical switch and is arranged on the first flat side such that even with a connection of the mobile data storage device with a data processing device largely unhindered access to an activating element of the switch for selecting the operating mode is possible. By means of said switch for selecting the mode of operation it can be established for example, whether access to the mobile data storage device is only read or write. The display for showing the operating mode is designed for example to display the currently selected mode of operation as well as access that has been made to the mobile data storage device. In addition, the latter is preferably arranged on the first flat side such that also in a connection of the mobile data storage device to a data processing device the displayed status can be identified clearly.

For handling the mobile data storage device according to the invention a development is advantageous, in which the support layer including the component arranged on the first and second flat side is arranged in a housing. The housing is preferably designed to be compact, such that the support layer including the arranged components are covered or protected by the housing, without impairing the connection of the communication connection to a data processing device.

A particularly advantageous development is obtained if the housing comprises a coupling device. By means of this development the mobile data storage device can be attached simply, rapidly and optionally detachably to a further device, for example to a device in daily use, where the mobile data storage device is carried about and is thus always available.

An advantageous development is also obtained if the housing is designed to be transparent, as in this way for example a good view of the display showing the selection of operating mode is possible. A transparent housing could for example also be designed so that the light emitted by the display showing the operating mode is directed into the housing, so that the observer has the impression that the whole housing is illuminated.

The objective of the invention is also achieved by a Pocket-size tool or a tool card, in which the data storage device is formed by the mobile data storage device according to the invention. A pocket-size tool, in particular a pocket knife, is a device that is in daily use for many people and is thus also mostly always carried about, so that the data storage device according to the invention does not appear as an additional device. In this way in an advantageous way the number of components to be carried about is reduced for the user and there is no risk of forgetting them on the particularly compact mobile data storage device. With regard to daily use an embodiment is advantageous in which the data storage device can be pivoted between a storage position and an operating position. The compact mobile data storage device is exposed to an increased risk of damage when in daily use. By means of an advantageous development it is ensured that the mobile data storage device is only pivoted out of a protected storage position, in particular swung out, when in a position of use. The rest of the time the mobile data storage device is protected in the storage position from mechanical influences and if necessary from minor environmental influences. The storage position can be designed for example to ensure protection from dust, dirt and moisture.

A development is particularly advantageous in which the data storage device is optionally connected in a couplable manner with the pocket-size tool. The mobile data storage device, in particular the housing, comprises if necessary a coupling device, which is formed for example by a clamping and/or locking connection and by means of which the mobile data storage device can be connected optionally with a corresponding coupling means of the pocket-size tool. This is an advantage, as in this way the mobile data storage device can be uncoupled from the mostly larger pocket-size tool and owing to its compact design can be connected easily to a data processing device.

The invention is explained in more detail in the following with reference to the exemplary embodiments shown in the drawings.

FIG. 1 a) to c) show several views of the mobile data storage device according to the invention;

FIG. 3 shows a detailed view of the communication connection;

Figure 2A:
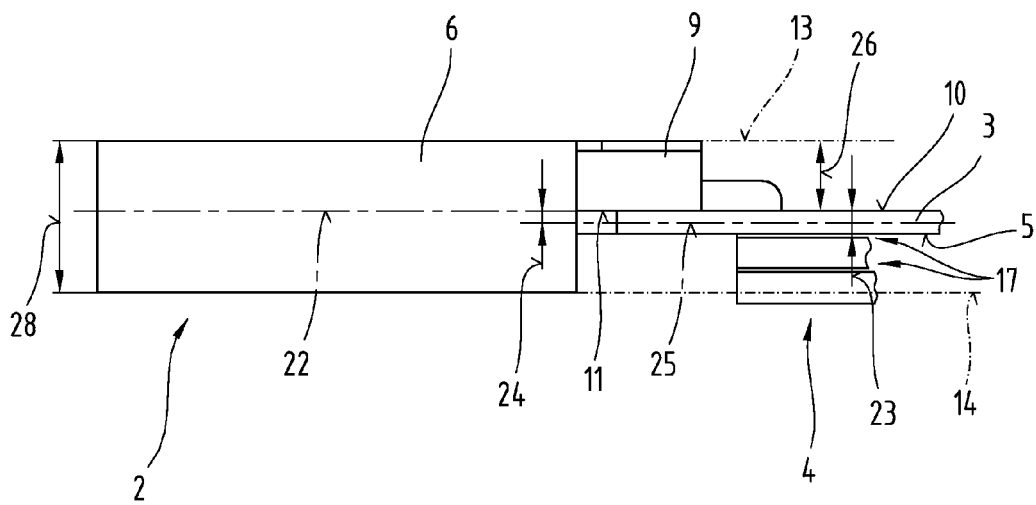
FIG. 2 shows a view of the improved space ratios by means of the arrangement according to the invention.

FIGS. 4 a) and b) show a development of the data storage device according to the invention in a pocket-size tool.

First of all, it should be noted that in the variously described exemplary embodiments the same parts have been given the same reference numerals and the same component names, whereby the disclosures contained throughout the entire description can be applied to the same parts with the same reference numerals and same component names. Also details relating to position used in the description, such as e.g. top, bottom, side etc. relate to the currently described and represented figure and in case of a change in position should be adjusted to the new position. Furthermore, also individual features or combinations of features from the various exemplary embodiments shown and described can represent in themselves independent or inventive solutions.

All of the details relating to value ranges in the present description are defined such that the latter include any and all part ranges, e.g. a range of 1 to 10 means that all part ranges, starting from the lower limit of 1 to the upper limit 10 are included, i.e. the whole part range beginning with a lower limit of 1 or above and ending at an upper limit of 10 or less, e.g. 1 to 1.7, or 3.2 to 8.1 or 5.5 to 10.

FIG. 1a shows a plan view of the mobile data storage device 1 according to the invention which comprises a communication connection 2, a support layer 3 and at least one semiconductor storage device 4, wherein the latter is arranged on the second flat side 5 of the support layer 3. The communication connection 2 is preferably designed as a couplable plug connection, in particular a USB-connector (Universal Serial Bus) is used according to the standard DIN IEC 61076-3-107 or DIN IEC 61076-3-108. Said connector types are characterised by providing a particularly reliable contact as well as easy connectability and are particularly widespread in the field of data processing devices. Particularly preferably, a type A USB-connector 6 is used, which has a width 7 of about 12 mm. In order to obtain a structure of the mobile data storage device that is as compact as possible the support layer 3 is preferably designed such that the width 8 of the support layer 3 corresponds essentially to the width 7 of the communication connection 2 or is only slightly greater. This design ensures in an advantageous manner that the mobile data storage device 1 according to the invention can also be connected with very small space ratios to a data processing device via the communication connection 2. This design also has the advantage that the semiconductor-storage unit 4 is arranged reliably on the second flat side 5 of the support layer 3 and can be contacted electrically, whereby the support layer 3 for example is only greater than the semiconductor module 4 by a minimum amount, in particular is wider, in order to contact the latter reliably electrically.

In one development the width 8 of the support layer 3 can also be much greater than the width 7 of the communication connection 2, in particular such a design is an advantage if sufficient space is available, for example if the mobile data storage device is connected via a communication line to the communication connection 2 of a data processing device. In this embodiment for example several semiconductor storage devices 4 can be arranged next to one another on the second flat side 5 of the support layer 3.

FIG. 1b shows the mobile data storage device 1 according to the invention of FIG. 1a in side view. The USB-connector 6 has a contact section 9, wherein via said contact section an electricity conducting contact of the plug contacts of the connectors 6 with the corresponding contact partners is produced on the first flat side 10 of the support layer 3. In addition, the support layer 3 is arranged on a mounting surface 11 of the contact sections 9 such that the electricity conducting contact sections 20 of the contact section 9 coincide with the corresponding sections on the first flat side 10 of the support layer and in this way an electricity conducting connection is produced. If necessary the contact section 9 or the mounting surface 11 comprise means for connecting the support layer 3 mechanically with the contact section 9 or the connector 6.

On the first flat side 10 a communication and access control 12 is arranged which performs the signal and level technical adjustment between the communication connection 2, in particular a USB-communication connection 6 and the semiconductor storage device 4. As the adjustment of the signal level mostly also requires a change in the voltage level, such devices with a high integration density also require a specific structural volume, the communication and access control 12 require a significant volume, in particular the module 12 has a minimum component height. The mobile data storage device 1 according to the invention has the advantage that with the arrangement of the support layer in relation to the communication connection 2 there is a much improved spacing between the first flat side 10 of the support layer and the first imaginary boundary plane 13, and between the second flat side 5 of the support layer 3 and the second imaginary boundary plane 14. The arrangement according to the invention of the support layer 3 has the further particular advantage that on the second flat side 5 above the first semiconductor-storage unit 15 a second semiconductor storage module 16 can be arranged, whereby if necessary between the two storage modules 15, 16 an air gap 17 can be provided. By means of this arrangement it is ensured that compared to known data storage devices the mobile data storage device 1 according to the invention forms a much greater storage ability per volume unit, in particular this is mostly doubled. By means of the provided air gap 17 it is ensured that waste heat produced during operation of the semiconductor storage device 4 can be removed sufficiently and thus overheating of the modules is prevented. Also an air gap 17 can be provided between the support layer 3 and the first semiconductor storage device 15.

On the first flat side 10 a switch for selecting the operating mode 18 and a display for showing the operating mode 19 can be arranged. By means of the switch for selecting the operating mode 18 it can be determined for example, whether the semiconductor storage device can be accessed only by reading or writing. The respectively selected operating mode and the currently performed action can be shown by the display for showing the operating mode 19.

FIG. 1c shows a plan view of the mobile data storage device 1, in particular of the first flat side 10 of the support layer 3. On said flat side 10 the communication and access control 12, the device for selecting the operating mode 18 and the display for showing the operating mode 19 are arranged. Also the contact section 9 is shown clearly and in particular the contacts 20, which enable an electrical connection with the contact sections of the first flat side and the contacts 21 of the communication connection 2 or connector 6.

The device for selecting the operating mode 18 is preferably arranged on a longitudinal side of the support layer 3, whereby access to the selection device is facilitated, which is particularly advantageous if several data storage devices are connected to a data processing device. Therefore, also the arrangement of the display for showing the operating mode 19 on the end side of the support layer opposite the communication connection 2 is advantageous, as particularly good visibility of the display for showing the operating mode is achieved.

Figure 2B:
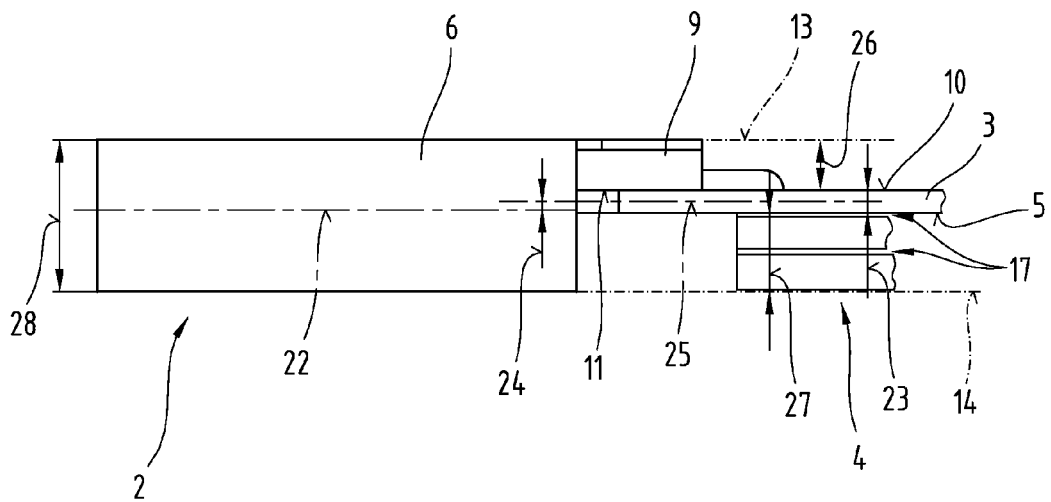

FIGS. 2a and 2b show the difference in the arrangement of the support layer and thus the different distances in a known arrangement and in an arrangement according to the invention. FIG. 2a shows a known arrangement in which the mounting surface 11 of the contact section 9 coincides substantially with the middle plane 22 of the communication connection 2 or the connector 6. Owing to the thickness 23 of the support layer 3 of 0.9 mm there is thus an offset 24 of the middle plane 22 of about 0.45 mm, wherein the offset is marked in the direction of the second boundary line 14. With these dimensions a distance 26 is obtained between the first flat side 10 and the first boundary plane 13 of about 2.25 mm. In this space preferably the communication and access control, the device for selecting the operating mode as well as the display for showing the operating mode are arranged. Furthermore, a distance 27 is obtained between the second flat side 5 and the second boundary plane 14 of about 1.35 mm, whereby on said flat side 5 the semiconductor storage device 4 is arranged. In particular, it can be clearly seen that in an arrangement of two semiconductor storage modules on top of one another, the latter would project over the second boundary plane 14, which opposes a very compact design.

In the design of the mobile data storage device according to the invention in FIG. 2b it can clearly be seen that the mounting surface 11 of the contact section 9 no longer coincides with the middle plane 22 of the contact connection 2 or the connector 6, whereby in particular together with a reduction in the thickness 23 of the support layer 3 to 0.4-0.5 mm, there is a much reduced offset 24 of 0.55-0.5 mm, in particular the middle plane 25 of the support layer 3 lies on the side of the middle plane 22 of the contact connection 2 facing the first boundary plane 13. By means of this advantageous design the distance 27 increases essentially to 2.8-2.75 mm, without the distance 26 reducing by 1.5 mm, such that an arrangement of the communication and access control and the device for selecting the operating mode is restricted or hindered within the first boundary plane 13.

Compared to the communication and access control and in particular a mechanical component such as the device for selecting the operating mode, semiconductor components mostly have a very low structural height. By means of the arrangement according to the invention the distance 27 is increased such that on the second flat side 5 two semiconductor storage modules can be arranged on top of one another without projecting over the second boundary plane 14. At the same time the distance 26 is adjusted only in that the additional necessary components can be arranged on the first flat side 10, without projecting over the first boundary plane 13. Compared to known arrangements, by means of the arrangement according to the invention always a much greater storage capacity can be obtained, in particular mostly double the storage capacity, without having to change substantially the dimensions of the mobile data storage device.

With regard to technical progress the further miniaturising of components is to be expected. In particular, new developments in the materials of the support layers will involve a further reduction in the thickness. Also the semiconductor storage modules and the communication and access control and the device for selecting the operating mode can be designed to be more compact. In this way a third semiconductor storage module can be provided, which will enable a further increase in the storage volume, with substantially the same volume of the structural body.

FIG. 3 shows the communication connection 2, in particular a USB-connector 6, which has a standard structural height 28. To achieve a structure of the mobile data storage device that is as compact as possible it is particularly advantageous if the support layer, the semiconductor storage device and the components required for controlling the communication or access can be restricted in their height so that the first 13 and the second 14 boundary planes are not affected. In the design according to the invention the contact section 9 of the communication connection or the connector 6, but in particular the mounting surface 11 are arranged offset relative to the middle plane 22. By means of this offset 24 the support layer, which is arranged on the mounting surface 11, is offset clearly in the direction of the first boundary plane 13, more than is the case in known devices. The contact section 9 also comprises contacts 20 which form an electrical connection with the contacts 21 of the connector 6 and which are connected in an electrically conducting manner to corresponding contact partners of the support layer. If necessary, the contact section 9 can also comprise securing means 29, in order to fix the support layer mechanically to the contact section 9, in particular to the mounting surface 11.

It is particularly important that the arrangement of the contacts 21 of the standardised connectors are not changed. In particular, the latter are arranged in the middle plane 22. For a detailed representation of the contact arrangement reference is made to the corresponding standard. As according to the invention the mounting surface 11 is arranged offset in relation to the middle plane 22, the contacts 20 no longer lie in the middle plane 22. Therefore, the contacts 21 of the connector have to be moved further in the contact section 9 so that they can emerge at the end face of the contact section 9 and be connected there electrically with the conductor tracks.

Figure 4A:
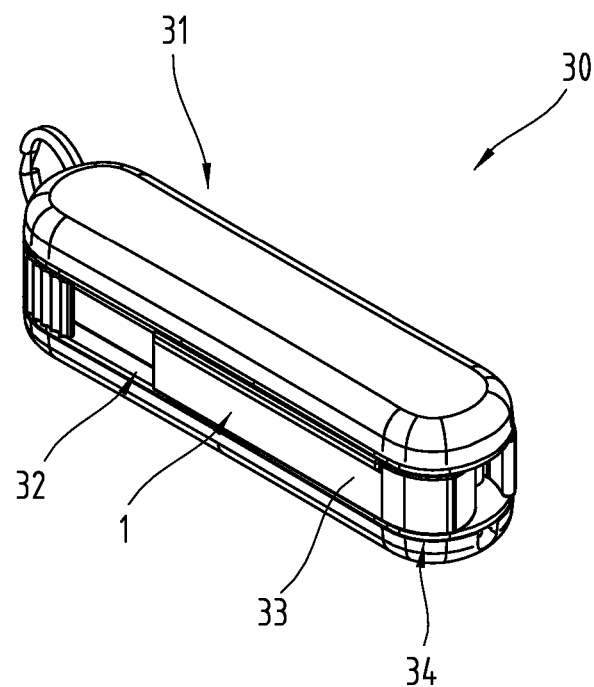
Figure 4B:
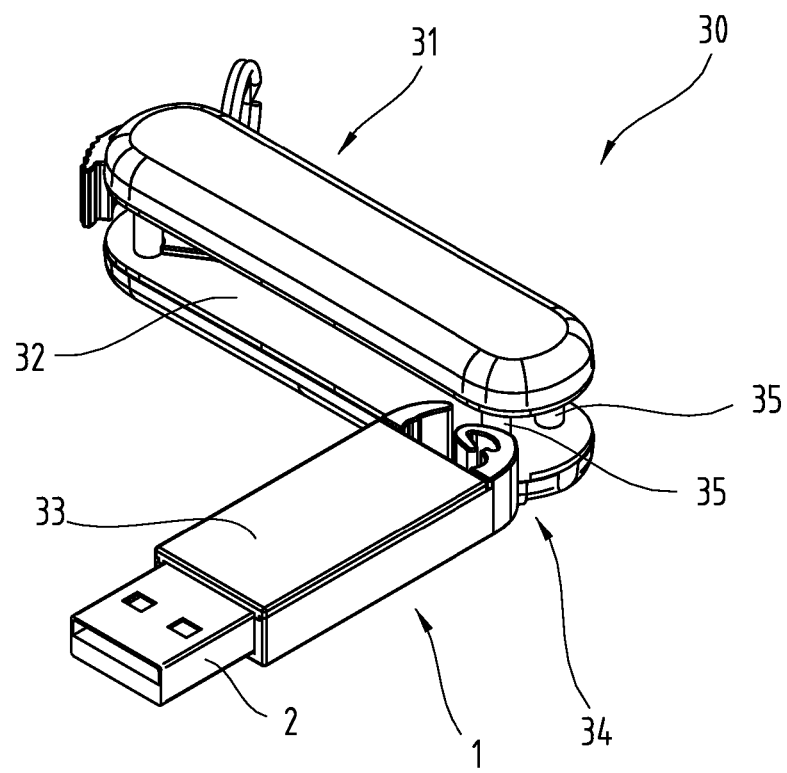

FIGS. 4a and 4b show the arrangement of the mobile data storage device according to the invention in a pocket-size tool 30, in particular in a pocket knife 31. The mobile data storage device 1 is thus pivotable from a storage position in a mounting area 32 of the pocket-size tool into an operating and/or removal position, as shown in FIG. 4b. To fix the mobile data storage device 1 onto or into the pocket-size tool 30 the mobile data storage device 1 is arranged in a housing 33 which comprises a coupling device 34. By means of said coupling device 34 the housing is connected optionally detachably to the pocket-size tool, in particular by arranging and clamping onto assembly axes 35 of the pocket-size tool 30. For simpler handling or with limited space ratios the housing with the mobile data storage device according to the invention can thus be released from the pocket-size tool and connected via the communication connection 2 to a data processing device. In FIG. 4b this design has the particular advantage that a mobile data storage device compared to known data storage devices with much greater storage capacity is arranged in a device for daily use, and this device can be reliably protected from mechanical influences when not in use and can be removed easily and rapidly from the pocket-size tool.

The exemplary embodiments show possible embodiment variants of the mobile data storage device, whereby it should be noted at this point that the invention is not restricted to the embodiment variants shown in particular, but rather various different combinations of the individual embodiment variants are also possible and this variability, due to the teaching on technical procedure, lies within the ability of a person skilled in the art in this technical field. Thus all conceivable embodiment variants, which are made possible by combining individual details of the embodiment variants shown and described, are also covered by the scope of protection.

FIG. 4 shows a further and possibly independent embodiment of the mobile data storage device, wherein the same reference numbers and component names are used for the same parts as in the preceding Figures. To avoid unnecessary repetition reference is made to the detailed description of the preceding FIG. 1.

Finally, as a point of formality, it should be noted that for a better understanding of the structure of the mobile data storage device the latter and its components have not been represented true to scale in part and/or have been enlarged and/or reduced in size.

The problem addressed by the independent solutions according to the invention can be taken from the description.

Mainly the individual embodiments shown in FIGS. 1 to 4 can form the subject matter of independent solutions according to the invention. The objectives and solutions according to the invention relating thereto can be taken from the detailed descriptions of these figures.

LIST OF REFERENCE NUMERALS

1 Mobile data storage device
2 Communication connection
3 Support layer
4 Semiconductor storage device
5 Second flat side
6 USB-connector, type A
7 Width
8 Width
9 Contact section
10 First flat side
11 Mounting surface
12 Communication and access control
13 First boundary plane
14 Second boundary plane
15 First semiconductor storage module
16 Second semiconductor storage module
17 Air gap, distance
18 Device for selecting operating mode
19 Display of operating mode
20 Contact
21 Contact
22 Middle plane
23 Thickness
24 Offset
25 Middle plane
26 Distance
27 Distance
28 Height
29 Securing means
30 Pocket-size tool
31 Pocket knife
32 Mounting area
33 Housing
34 Coupling device
35 Assembly axes

The invention claimed is:
1. A mobile data storage device with high storage density comprising:

(a) a support layer comprising a first side and a second side that is substantially parallel to the first side and spaced apart from the first side by a support layer thickness;
(b) a communication connection comprising:
  (i) a connector section comprising a connector upper surface and a connection surface positioned substantially parallel to the connector upper surface and spaced apart from the connector upper surface by a connector section thickness; and
  (ii) a contact section positioned adjacent an end of the connector section, wherein the contact section comprises a contact upper surface substantially aligned with the connector upper surface and a mounting surface positioned substantially parallel to the contact upper surface and spaced apart from the contact upper surface by a contact section thickness that is less than the connector section thickness, wherein a difference between the connector section thickness and the contact section thickness approximates the support layer thickness, wherein an end of the first side of the support layer is positioned adjacent the mounting surface so that the second side of the support layer is substantially aligned with the connection surface and at least a portion of the contact section overlaps at least a portion of the support layer; and
(c) at least one semiconductor storage device including non-volatile read-write memory.

2. A mobile data storage device according to claim 1, wherein the communication connection is formed by a connectable connector.

3. A mobile data storage device according to claim 2, wherein the connector is in the form of a USB-plug-and-socket connector.

4. A mobile data storage device according to claim 1, wherein the mounting surface includes at least one contact face electrically coupled with at least one contact face disposed on the first side of the support layer.

5. A mobile data storage device according to claim 1, wherein the contact section includes means for mechanically securing the support layer.

6. A mobile data storage device according to claim 1, wherein the support layer is formed by a circuit board.

7. A mobile data storage device according to claim 1, wherein the support layer thickness is less than 1 mm.

8. A mobile data storage device according to claim 1, wherein a communication and access control is arranged on the first side of the support layer.

9. A mobile data storage device according to claim 1, wherein the at least one semiconductor storage device is formed by a first semiconductor storage module, which is arranged on the second side of the support layer.

10. A mobile data storage device according to claim 9, wherein the at least one semiconductor storage device includes a second semiconductor storage module which is arranged above the first semiconductor storage module.

11. A mobile data storage device according to claim 10, wherein the first semiconductor storage module and the second semiconductor storage module are arranged spaced apart from one another.

12. A mobile data storage device according to claim 1, wherein the connector upper surface and the contact upper surface are substantially aligned with a first boundary plane, wherein a distance between the first side of the support layer and the first boundary plane is between about 1.40 mm and 1.60 mm.

13. A mobile data storage device according to claim 1, wherein the connection surface is substantially parallel to a second boundary plane and spaced apart from the second boundary plane by a distance approximating the connector section thickness so that the connection surface forms a plane that is parallel to and located at a midpoint between the second boundary plane and the connector upper surface, wherein the distance between the second side of the support layer and the second boundary plane is between about 2.65 mm and 2.90 mm.

14. A mobile data storage device according to claim 1, wherein a width of the support layer is smaller than or equal to a width of the communication connection.

15. A mobile data storage device according to claim 1, wherein a height of the support layer including components arranged thereon is smaller than or equal to a height of the communication connection.

16. A mobile data storage device according to claim 8, wherein the communication and access control includes a device for selecting an operating mode and/or a display for showing the operating mode.

17. A mobile data storage device according to claim 1, wherein the support layer including the components arranged on the first and second sides is arranged in a housing.

18. A mobile data storage device according to claim 17, wherein the housing includes a coupling device.

19. A mobile data storage device according to claim 17, wherein the housing is includes transparent material.

20. A pocket-sized tool or tool card having a mobile data storage device in accordance with claim 1.

21. The pocket-sized tool or tool card according to claim 20, wherein the mobile data storage device can be moved between a storage position and an operating position.

22. The pocket-sized tool or tool card according to claim 20, wherein the mobile data storage device is removably connected.

* * * * *